(12) United States Patent
Ko et al.

(10) Patent No.: US 9,870,943 B2
(45) Date of Patent: Jan. 16, 2018

(54) CONTACT PROCESS AND CONTACT STRUCTURE FOR SEMICONDUCTOR DEVICE

(71) Applicant: MACRONIX International Co., Ltd., Hsinchu (TW)

(72) Inventors: Zong-Jie Ko, Hsinchu (TW); Hsiao-Leng Li, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 26 days.

(21) Appl. No.: 14/598,645

(22) Filed: Jan. 16, 2015

(65) Prior Publication Data

US 2016/0211139 A1    Jul. 21, 2016

(51) Int. Cl.
| | |
|---|---|
| H01L 23/58 | (2006.01) |
| H01L 21/768 | (2006.01) |
| H01L 29/08 | (2006.01) |
| H01L 21/283 | (2006.01) |
| H01L 29/417 | (2006.01) |
| H01L 29/66 | (2006.01) |
| H01L 27/11573 | (2017.01) |
| H01L 21/285 | (2006.01) |
| H01L 29/267 | (2006.01) |

(52) U.S. Cl.
CPC ...... *H01L 21/76831* (2013.01); *H01L 21/283* (2013.01); *H01L 21/28525* (2013.01); *H01L 21/76802* (2013.01); *H01L 21/76897* (2013.01); *H01L 27/11573* (2013.01); *H01L 29/0847* (2013.01); *H01L 29/41783* (2013.01); *H01L 29/665* (2013.01); *H01L 29/66628* (2013.01); *H01L 29/66636* (2013.01); *H01L 21/76805* (2013.01); *H01L 29/267* (2013.01)

(58) Field of Classification Search
CPC ........................ H01L 21/283; H01L 21/76802
See application file for complete search history.

(56) References Cited

U.S. PATENT DOCUMENTS

| | | | | |
|---|---|---|---|---|
| 6,046,103 A | * | 4/2000 | Thei ................... | H01L 21/28518 257/E21.165 |
| 2006/0054953 A1 | * | 3/2006 | Son ..................... | H01L 27/0629 257/296 |
| 2008/0124876 A1 | * | 5/2008 | Ryu ................... | H01L 21/28525 438/296 |
| 2012/0104514 A1 | * | 5/2012 | Park .................. | H01L 21/28518 257/411 |
| 2014/0248761 A1 | * | 9/2014 | Park .................. | H01L 21/82387 438/586 |

* cited by examiner

*Primary Examiner* — Jamie C Niesz
(74) *Attorney, Agent, or Firm* — J.C. Patents

(57) ABSTRACT

A contact process for a semiconductor device is described. A substrate having a doped region and a dielectric layer over the doped region is provided. A contact hole is formed through the dielectric layer and exposing the doped region. An insulating liner layer is formed a in the contact hole. A portion of the insulating liner layer at a bottom of the contact hole is etch-removed and over-etching is performed. A conductive epitaxial layer is formed from the doped region in the contact hole, and then the contact hole is filled with a conductive material.

10 Claims, 1 Drawing Sheet

CONTACT PROCESS AND CONTACT STRUCTURE FOR SEMICONDUCTOR DEVICE

BACKGROUND OF THE INVENTION

Field of Invention

This invention relates to a semiconductor process, and particularly relates to a contact process for a semiconductor device and a contact structure formed thereby.

Description of Related Art

A doped region of a semiconductor device that is required to be electrically connected to other element is usually connected to a contact plug first. In order to prevent ion impurity from entering the contact plug and also avoid a short circuit with a conductive part other than the target doped region, such as the gate in a MOS structure of the semiconductor device, an insulating liner layer is often formed on the sidewall of the contact hole before the conductive material of the contact plug is filled in the contact hole.

The insulating liner on the sidewall of the contact hole is usually formed by depositing a blanket layer and anisotropically etching the same to remove the portion of the insulating liner layer at the bottom of the contact hole. In order to well remove the portion to ensure a good electrical connection, over-etching is usually performed. However, it is possible that the metal silicide layer on the doped region for lowering the contact resistance is etched through in the over-etching process so that the contact resistance is increased.

SUMMARY OF THE INVENTION

In view of the foregoing, this invention provides a contact process for a semiconductor device, which is capable of preventing increase of the contact resistance.

This invention also provides a contact structure for a semiconductor device that is formed with the contact process of this invention.

The contact process for a semiconductor device of this invention is described below. A substrate having a doped region and a dielectric layer over the doped region is provided. A contact hole is formed through the dielectric layer and exposing the doped region. An insulating liner layer is formed in the contact hole. A portion of the insulating liner layer at the bottom of the contact hole is etch-removed and over-etching is performed. A conductive epitaxial layer is formed from the doped region in the contact hole, and then the contact hole is filled with a conductive material.

The conductive epitaxial layer may comprise $Si_{1-x-y}C_xP_y$, GaN, n-type polysilicon, or p-type doped polysilicon, wherein x ranges from 0.01 to 0.05 and y ranges from 0.01 to 0.05. It is also possible that the substrate further has a metal silicide layer on the doped region and the metal silicide layer is etched through due to the over-etching.

The contact structure for a semiconductor device of this invention includes a conductive epitaxial layer in a contact hole for a doped region, and a conductive material on the conductive epitaxial layer. The conductive material is surrounded by an insulating liner layer on the sidewall of the contact hole and fills the contact hole.

The conductive epitaxial layer may go through a metal silicide layer on the doped region.

Since a conductive epitaxial layer is formed to compensate for the removed metal silicide layer in the contact process or structure of this invention, the contact resistance can be prevented from increasing by utilizing this invention. Moreover, because of the presence of the conductive epitaxial layer in the case where the metal silicide layer is etched through, the process window of the contact hole etching process can be increased.

In order to make the aforementioned and other objects, features and advantages of this invention comprehensible, a preferred embodiment accompanied with figures is described in detail below.

DESCRIPTION OF EMBODIMENTS

This invention is further explained with the embodiment below, which is not intended to limit the scope thereof. For example, though in the embodiment the semiconductor device is a memory string in a memory array area or a MOS transistor in a peripheral circuit area and the doped region to be electrically connected is a source/drain (S/D) region of the memory string or MOS transistor, the contact process or structure of this invention can also be applied to a doped region of other type of semiconductor device that has a conduct part possibly exposed in the contact hole so that an insulating liner layer is formed in the contact hole.

Figure 1:
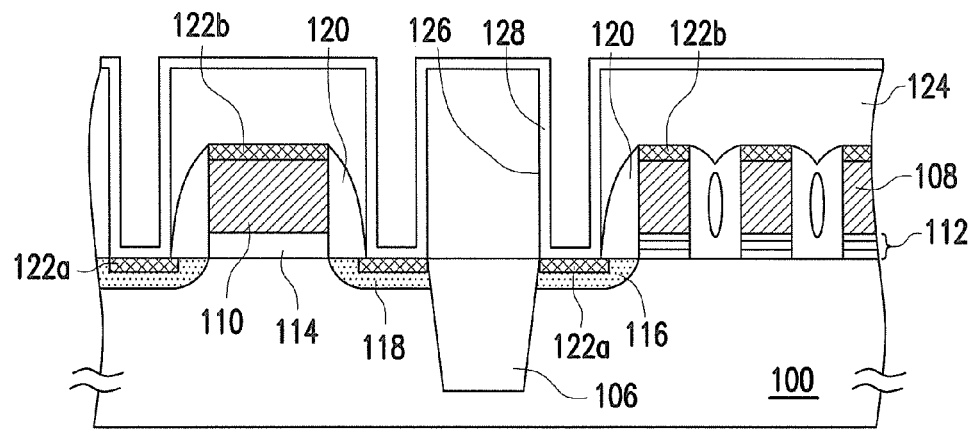
FIGS. 1 to 3 illustrate, in a cross-sectional view, a contact process for a semiconductor device according to an embodiment of this invention, wherein FIG. 3 also illustrates a contact structure of the embodiment.
Figure 2:
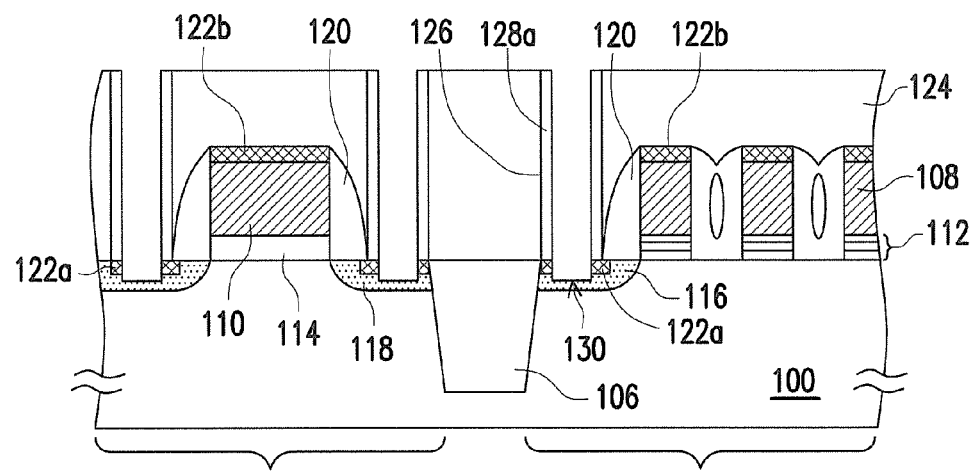
Figure 3:
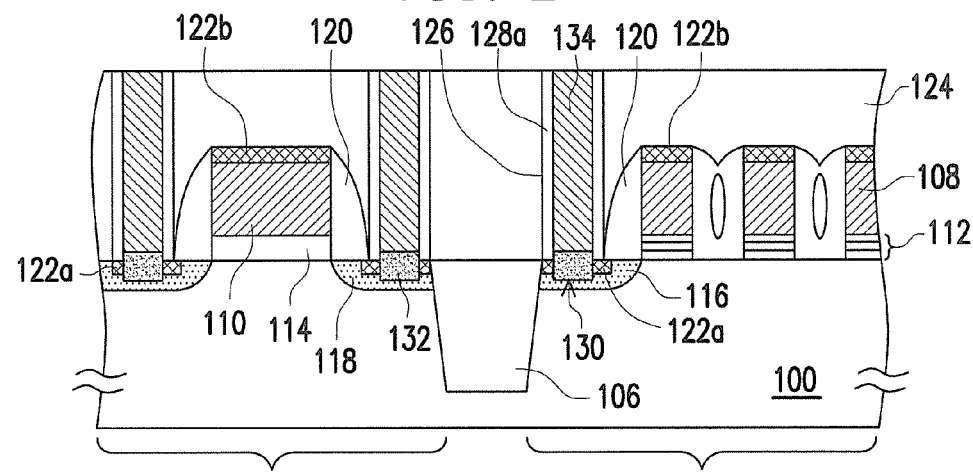

FIGS. 1 to 3 illustrate, in a cross-sectional view, a contact process for a semiconductor device according to an embodiment of this invention, wherein FIG. 3 also illustrates a contact structure of the embodiment.

Referring to FIG. 1, a substrate 100 is provided, having a memory array area 102 and a peripheral circuit area 104 separated by an isolation structure 106 such as a shallow trench isolation (STI) structure. The gates 108 of the memory array are disposed in the memory array area 102, and the gates 110 of the peripheral circuit are disposed in the peripheral circuit area 104. The gates 108 of the memory array are separated from the substrate 100 by a charge trapping layer 112, such as a silicon oxide/silicon nitride/silicon oxide (ONO) composite layer. The gates 110 of the peripheral circuit are separated from the substrate 100 by a gate dielectric layer 114, such as a silicon oxide layer. S/D regions 116 of each memory string are formed in the substrate 100 beside the memory string (only one S/D at one side is shown), and S/D regions 118 of each peripheral device are formed in the substrate 100 beside the peripheral device. A spacer 120 is formed on the sidewall of each of the memory string and the peripheral device, possibly including silicon nitride (SiN). A metal silicide layer 122a is formed on each of the S/D regions 116 and 118 beside the spacer 120, and a metal silicide layer 122b is formed on each of the gates 108 and 110, in a self-aligned silicide (salicide) process. The metal silicide layer 122a/b usually includes $CoSi_2$, NiSi, NiPtSi, $TiSi_2$, or WSi. A dielectric layer 124 is formed covering all the parts describe above, possibly including silicon oxide.

Thereafter, contact holes 126 are formed through the dielectric layer 124 exposing the S/D regions 116 and 118, respectively, by anisotropic etching through a patterned mask (not shown). An insulating liner layer 128 is formed in each contact hole 126, specifically, at the bottom and on the sidewall of the contact hole 126. The insulating liner layer 128 may include SiN or SiON.

Referring to FIG. 2, the portion of the insulating liner layer 128 at the bottom of each contact hole 126 is removed by anisotropic etching, leaving the insulating liner layer 128a on the sidewall of the contact hole 126, and over-etching is performed to completely remove the portion of the insulating liner layer 128 at the bottom. In the over-etching, the silicide layer 122b may be etched through, and, depending on the location on the wafer, a recess 130 may possibly be formed in the S/D region 116 or 118 by the over-etching.

Referring to FIG. 3, a conductive epitaxial layer 132 is formed from each of the S/D regions 116 and 118 in the contact holes 126, and then the contact holes 126 are filled with a conductive material 134. The conductive epitaxial layer 132 may include $Si_{1-x-y}C_xP_y$, GaN, n-type polysilicon, or p-type polysilicon, and may have a thickness of about 300 Å when including $Si_{1-x-y}C_xP_y$, wherein the x-value may range from 0.01 to 0.05 and the y-value may range from 0.01 to 0.05. It is possible that when the conductive epitaxial layer 132 includes $Si_{1-x-y}C_xP_y$, the concentration of phosphorus is within the range of $2.0 \times 10^{20}$ cm$^{-3}$ to $2.5 \times 10^{20}$ cm$^{-3}$ and the concentration of carbon is within the range of $9.0 \times 10^{20}$ cm$^{-3}$ to $9.5 \times 10^{20}$ cm$^{-3}$. In a case that the recess 130 is formed in the S/D region 116 or 118 in the over-etching of the insulating liner layer 128, a bottom portion of the conductive epitaxial layer 132 is embedded in the S/D region 116 or 118, as shown in the figure. The conductive material 134 may include tungsten, Al, AlSi, WSi or copper.

Since a conductive epitaxial layer 132 is formed to compensate for the removed metal silicide layer 122b in the contact process or structure of this invention, the contact resistance can be prevented from increasing.

Moreover, because of the presence of the conductive epitaxial layer 132 in the case where the metal silicide layer 122b is etched through, the process window of the etching process of the contact holes 126 can be increased.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A contact structure for a semiconductor device, comprising:
 a conductive epitaxial layer in a contact hole for a doped region in a substrate, wherein the conductive epitaxial layer completely covers a bottom surface of the contact hole and is embedded in a metal silicide layer on the doped region; and
 a conductive material on the conductive epitaxial layer, surrounded by an insulating liner layer on a sidewall of the contact hole and filling the contact hole,
 wherein entirety of the conductive epitaxial layer is substantially located below the conductive material.

2. The contact structure of claim 1, wherein the conductive epitaxial layer comprises $Si_{1-x-y}C_xP_y$, GaN, n-type polysilicon or p-type polysilicon, wherein x ranges from 0.01 to 0.05 and y ranges from 0.01 to 0.05.

3. The contact structure of claim 1, wherein the conductive epitaxial layer goes through the metal silicide layer on the doped region.

4. The contact structure of claim 3, wherein a bottom portion of the conductive epitaxial layer is embedded in the doped region.

5. The contact structure of claim 3, wherein the epitaxial layer comprises $Si_{1-x-y}C_xP_y$, x ranges from 0.01 to 0.05, and y ranges from 0.01 to 0.05.

6. The contact structure of claim 5, wherein in the epitaxial layer, a concentration of phosphorus is within a range of $2.0 \times 10^{20}$ cm$^{-3}$ to $2.5 \times 10^{20}$ cm$^{-3}$ and a concentration of carbon is within a range of $9.0 \times 10^{20}$ cm$^{-3}$ to $9.5 \times 10^{20}$ cm$^{-3}$.

7. The contact structure of claim 3, wherein the metal silicide layer comprises $CoSi_2$, NiSi, NiPtSi, $TiSi_2$, or WSi.

8. The contact structure of claim 1, wherein the insulating liner layer comprises silicon nitride (SiN) or SiON.

9. The contact structure of claim 1, wherein the conductive material comprises tungsten, Al, AlSi, WSi or copper.

10. The contact structure of claim 1, wherein the doped region is a source/drain region of a MOS structure.

* * * * *